United States Patent [19]

Satoh et al.

[11] Patent Number: 4,818,960

[45] Date of Patent: Apr. 4, 1989

[54] COMPOSITE PART AND METHOD OF MANUFACTURING SAME

[75] Inventors: Hiroshi Satoh; Tadao Yahagi, both of Tokyo, Japan

[73] Assignee: TDK Corporation, Tokyo, Japan

[21] Appl. No.: 201,348

[22] Filed: Jun. 1, 1988

Related U.S. Application Data

[63] Continuation of Ser. No. 34,962, Apr. 6, 1987, abandoned.

[51] Int. Cl.$^4$ .............................................. H03H 7/00
[52] U.S. Cl. .................................. 333/185; 333/167; 174/52.4; 29/827
[58] Field of Search ............... 333/167, 175, 177, 185; 361/395, 400, 406; 174/52 FP; 29/827, 832, 835, 838

[56] References Cited

U.S. PATENT DOCUMENTS 4,490,706 12/1984 Satou et al. ........................... 336/96
4,633,582 1/1987 Ching et al. ..................... 174/52 FP

FOREIGN PATENT DOCUMENTS 6233304 8/1980 Japan .
0085305 6/1983 Japan .
0159013 9/1983 Japan .
0014313 1/1984 Japan .
0029115 2/1986 Japan .
0029116 2/1986 Japan .
0029117 2/1986 Japan .

Primary Examiner—Eugene R. LaRoche
Assistant Examiner—Seung Ham
Attorney, Agent, or Firm—Armstrong, Nikaido, Marmelstein & Kubovcik

[57] ABSTRACT

A composite part and a method of manufacturing the same, comprising a plurality of pairs of terminal members formed in punched regions of a lead frame opposite to each other and shaped by cutting at predetermined positions a plurality of pairs of projection segments coupled at the respective base portions thereof; a plurality of circuit parts disposed and connected between the pairs of projection segments, and an armor molded in a region except the circuit parts and the base portions of the projection segments. The fore ends of the projection segments extending outward from the armor and formable into different shapes depending on the cut points are bent along the wall surfaces of the armor. Accordingly, there can be produced a composite part having any desired one of various functions by selectively changing the cut points of the projection segments. Since such selective change of the cut points can be achieved in the stage of use as well as that of manufacture, a remarkable advantage is attainable.

29 Claims, 8 Drawing Sheets

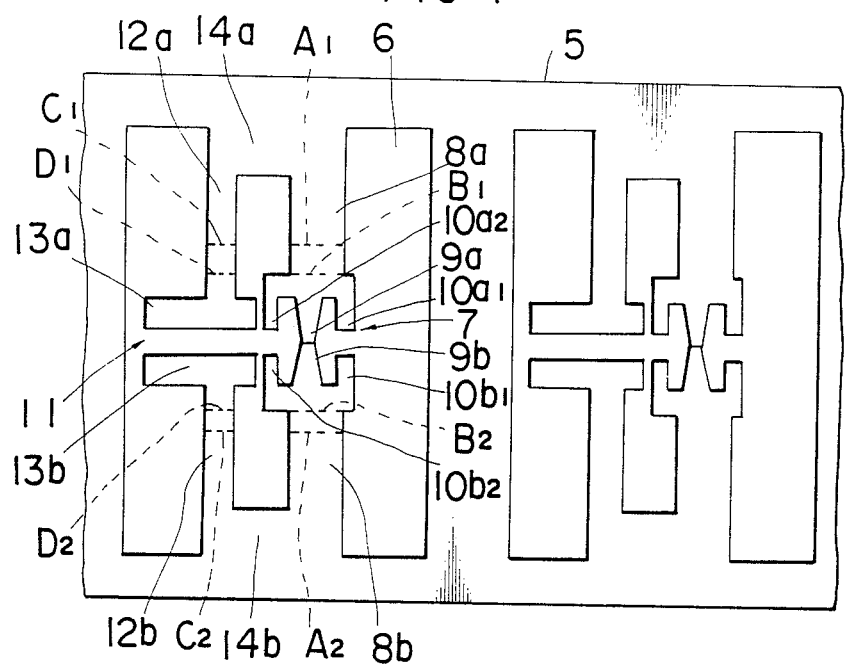
FIG. 1
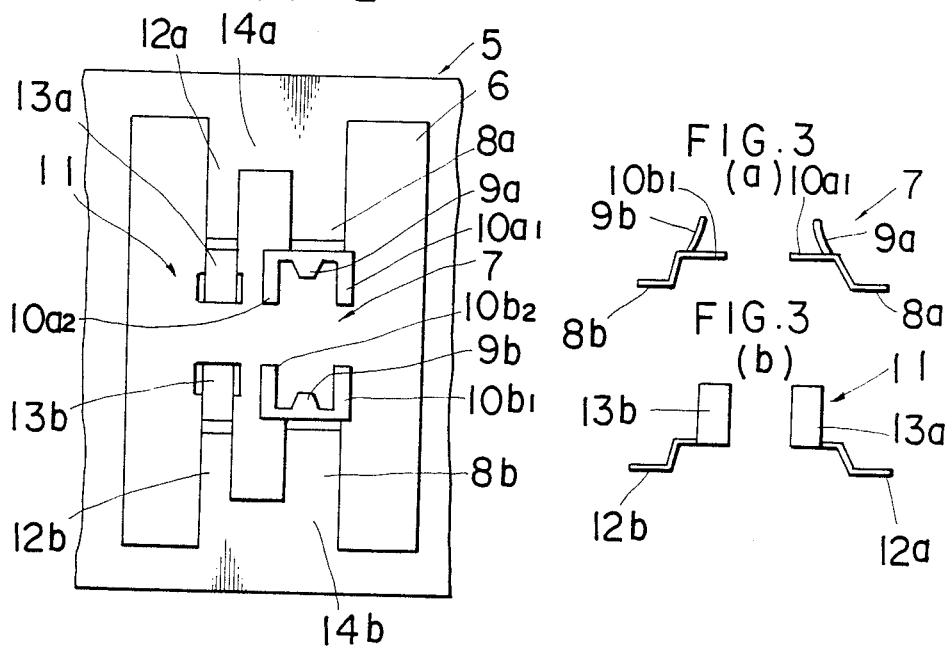
FIG. 2
FIG. 3 (a)
FIG. 3 (b)

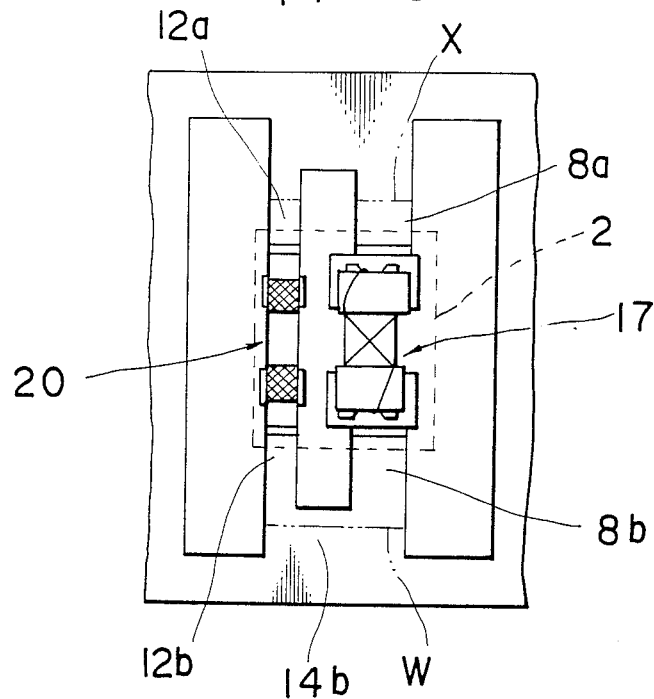
FIG.18
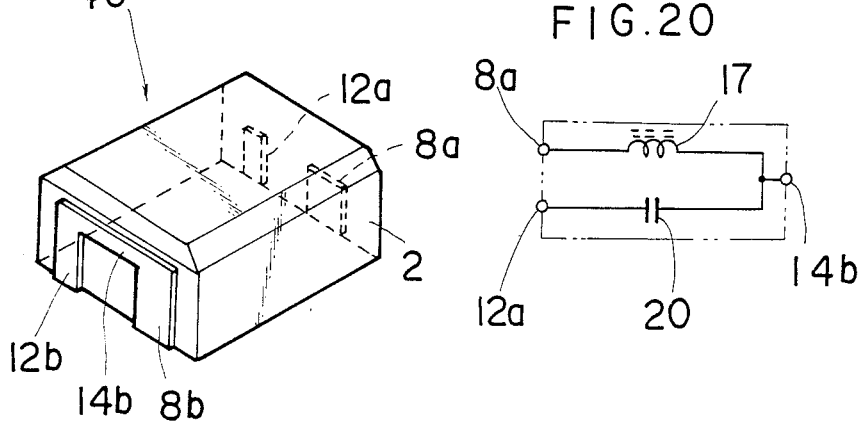
FIG.19
FIG.20

COMPOSITE PART AND METHOD OF MANUFACTURING SAME

This application is a continuation of application Ser. No. 034,962, filed Apr. 6, 1987, now abandoned.

BACKGROUND OF THE INVENTION

1. Field of the Invention

The present invention relates to a composite part, and a method of manufacturing the same, for use in an electronic circuit of a video tape recorder, wireless apparatus, radio receiver or the like.

2. Description of the Prior Art

It has been customary heretofore that each of circuit parts such as inductors, transformers, capacitors, resistors and so forth to be mounted on a printed wiring board for an electronic circuit is manufactured as an individual element or in the form of a composite part where two circuit elements such as an inductor and a capacitor are housed in a molded armor of synthetic resin or the like with connecting leadwires projecting therefrom.

However, the operation for mounting such a conventional circuit part or composite part on a printed wiring board is extremely intricate due to the existence of leadwires, and therefore a satisfactory result is not attainable technically with respect to the printed wiring board. And some inconvenience is unavoidable in handling as well because of relatively large dimensions of the conventional composite part mentioned above.

In a structure where a plurality of circuit parts are housed integrally in an armor, terminals for connection to an external circuit are provided individually for each circuit part, so that the mutual connection between the internal circuit parts housed in the armor needs to be shorted by the use of other leadwires or the like. This raises a problem that an additional time is required for mounting the circuit parts on the board. For solving the above problem, it becomes necessary to produce two types in the stage of manufacture, i.e. those with connected internal circuit parts and those with non-connected ones in conformity to individual uses, hence inducing a disadvantage of complicating the process of manufacture.

Furthermore, in a filter circuit composed of a plurality of combined circuit parts such as an LC filter circuit of an inductor L and a capacitor C combined with each other and housed in an armor integrally, a control member may be furnished for one of the circuit parts, e.g. the inductor to vary its inductance. However, even in such composite part, there still exists the aforesaid problem that two types of products having different relationship to connection need to be manufactured in accordance with individual uses as described above.

It is an object of the present invention to provide a composite part and a method of manufacturing the same, wherein a plurality of circuit parts can be integrated in small dimensions as a whole and formed into a lead-less type without any leadwire to consequently make a great contribution to improvement in the surface mounting technique, and still modes of connection between the circuit parts are alterable as desired in the stages of both manufacture and use.

And another object of the present invention resides in providing a composite part and a method of manufacturing the same with a function to adjust the electric characteristic thereof while realizing desired alteration of connection modes between its internal circuit parts in the stages of both manufacture and use.

SUMMARY OF THE INVENTION

To achieve the foregoing objects and in accordance with the purpose of the invention, as embodied and broadly described herein, the composite part of this invention comprises a plurality of pairs of terminal members formed in punched regions of a lead frame opposite to each other and shaped by cutting at predetermined positions a plurality of pairs of projection segments coupled in the respective base portions thereof; a plurality of circuit parts disposed between said pairs of projection segments; and an armor molded in a region except said circuit parts and the base portions of said projection segments: wherein the fore ends of said projection segments extending from said armor and formable into different shapes depending on the cut points thereof are bent along the wall surfaces of said armor.

And another composite part of this invention comprises a plurality of pairs of terminal members formed in punched regions of a lead frame opposite to each other and shaped by cutting at predetermined positions a plurality of pairs of projection segments coupled in the respective base portions thereof; a plurality of circuit parts including at least an inductor and disposed in said terminal members respectively; an armor molded in a region except said circuit parts and the base portions of said projection segments, and having a recess at its predetermined position corresponding to said inductor; and an inductance control member composed partially of a magnetic material and disposed in said recess: wherein the fore ends of said projection segments extending outward from said armor and formable into different shapes depending on the cut points thereof are bent along the wall surfaces of said armor, and the inductance of said inductor is settable at a desired value by adjusting the angle of rotation of said inductance control member.

In addition, to achieve the foregoing objects and in accordance with the purpose of the invention, as embodied and broadly described herein, the method of manufacturing the composite part of this invention comprises the steps of: disposing a plurality of circuit parts respectively in a plurality of pairs of terminal members formed in punched regions of a lead frame opposite to each other and coupled in the respective base portions thereof; executing required wiring between said circuit parts and said terminal members; molding an armor out of synthetic resin in a region except said circuit parts and the base portions of said terminal members; and cutting at desired positions the fore ends of said terminal members extending outward from said armor, and then bending said fore ends along the outer wall surfaces of said armor: wherein a composite part having any desired one of various connection modes is produced by selectively changing the wiring of said circuit parts and the cut positions of said terminal members.

And another method of manufacturing the composite part of this invention comprises the steps of: disposing a plurality of circuit parts respectively in a plurality of parits of terminal members formed in punched regions of a lead frame opposite to each other and coupled in the respective base portions thereof, said circuit parts including at least an inductor to be connected to said terminal members; executing required wiring between said circuit parts and said terminal members; molding an armor out of synthetic resin in a region except said circuit parts and the base portions of said terminal members; forming a recess in said armor at a predetermined position corresponding to said inductor; disposing in said recess an inductance control member composed partially of a magnetic material; and cutting at desired positions the fore ends of said terminal members extending outward from said armor, and then bending said fore ends along the outer wall surfaces of said armor: wherein a composite part having any desired one of various connection modes is produced by selectively changing the wiring of said circuit parts and the cut positions of said terminal members.

BRIEF DESCRIPTION OF THE DRAWINGS

FIG. 1 is a plan view of a lead frame for constituting various composite parts thereon;

FIG. 2 is a plan view illustrating how first and second terminal members in FIG. 1 are bent;

FIG. 3 (a) is a side view of the bent state of the first terminal member;

FIG. 3 (b) is a side view of the bent state of the second terminal member;

FIG. 18 is a plan view showing positions to cut projection segments in a third embodiment of the invention;

FIG. 19 is a perspective view of a composite part manufactured by the third embodiment of the invention;

FIG. 20 is an equivalent circuit diagram of the composite part shown in FIG. 19;

DESCRIPTION OF THE PREFERRED EMBODIMENTS

Figure 4:
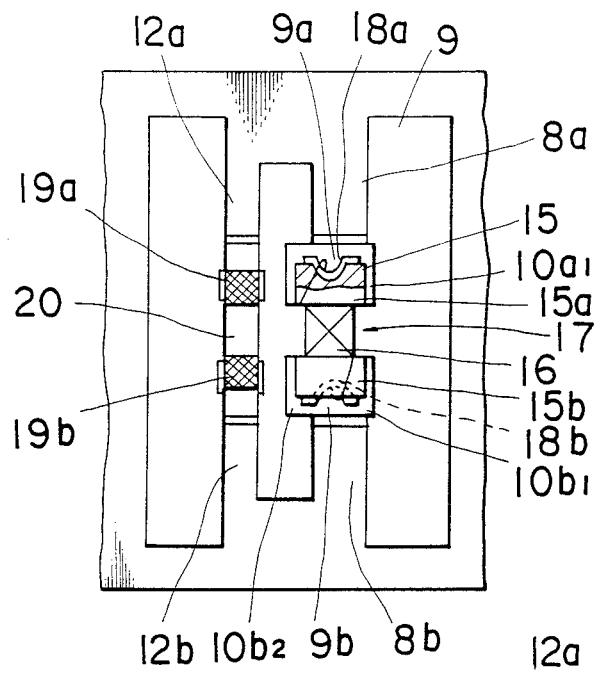
FIG. 4 is a plan view illustrating how an inductor and a capacitor are mounted and connected on the lead frame.

A first example embodying the method for manufacture of a composite part of the present invention will be described below with reference to FIGS. 1 through 10.

Initially a lead frame 5 of the shape shown in FIG. 1 is produced by press work out of a band-like conductive plate member.

In the lead frame 5, first and second terminal members 7, 11 are juxtaposed substantially at the center of a punched region 6. The first terminal member 7 comprises first projection segments 8a, 8b extending from the upper and lower sides of the lead frame in FIG. 1 toward the center of the punched region 6, and electrode connection segments 9a, 9b and support segments $10a_1$, $10a_2$, $10b_1$, $10b_2$ formed integrally at the respective centers of fore ends of the two projection segments 8a, 8b. In this arrangement, the electrode connection segments 9a and 9b, the support segments $10a_1$ and $10b_1$, and the support segments $10a_2$ and $10b_2$ are opposed to each other respectively.

The second terminal member 11 comprises second projection segments 12a, 12b parallel with the aforesaid first projection segments 8a, 8b, and second electrode connection segments 13a, 13b formed at the fore ends of the second projection segments 12a, 12b respectively, wherein the second electrode connection segments 13a, 13b protrude in the longitudinal direction of the lead frame 5 as shown in FIG. 1.

The first and second projection segments 8a, 12a are coupled to each other at one base portion 14a of the lead frame 5, while the projection segments 8b, 12b are coupled to each other at another base portion 14b of the lead frame 5.

In the next step, the first and second terminal members 7, 11 in the lead frame 5 of the shape mentioned above are bent as shown in FIGS. 2, 3 (a) and 3 (b).

Initially the projection segment 8a of the first terminal member 7 is bent vertically upward along a line A1 shown in FIG. 1, and then the electrode connection segment 9a and the support $10_1$, $10a_2$ are bent horizontally along a line B1.

Similarly, the projection segment 8b is bent vertically upward along a line A2 shown in FIG. 1, and then the electrode connection segment 9b and the support segments $10b_1$, $10b_2$ are bent together horizontally along a line B2. And subsequently the two horizontal electrode connection segments 9a, 9b are so curved as to confront each other.

The above procedure forms the first terminal member 7 which is capable of supporting a circuit part substantially at the center of the punched region 6, as shown in FIG. 3 (a).

Meanwhile, the second projection segments 12a, 2b are bent vertically upward along lines C1, C2 shown in FIG. 1 and then are bent horizontally along lines D1, D2. And subsequently two lateral portions of the electrode connection segments 13a, 13b in a horizontal posture are bent vertically upward.

The above procedure forms the second terminal member 11 which is capable of supporting a circuit part substantially at the center of the punched region 6, as shown in FIG. 3 (b).

In the next step, an inductor 17 is mounted opposite to the first terminal member 7 as shown in FIG. 4.

The inductor 17 comprises a drum core 15 composed of a magnetic material and a coil 16 wound around the drum core 15. Two flanges 15a, 15b of the drum core 15 have recessed outer end faces, where connecting electrodes 18a, 18b are disposed.

One flange 15a is held by the support segments $10a_1$, $10a_2$ while another flange 15b is held by the support segments $10b_1$, $10b_2$, so that the inductor 17 is positioned by the first terminal member 7. The electrode connection segments 9a, 9b are kept in contact with the electrodes 18a, 18b respectively, and the two ends of the coil 16 are led and soldered to the respective contact portions, whereby the coil 16 is connected electrically to the two electrode connection segments 9a, 9b.

Meanwhile relative to the second terminal member 11, a capacitor 20 having electrodes 19a, 19b at its two ends is mounted as shown in FIG. 4, and the electrodes 19a, 19b are connected electrically to the electrode connection segments 13a, 13b by means of soldering or the like.

Figure 5:
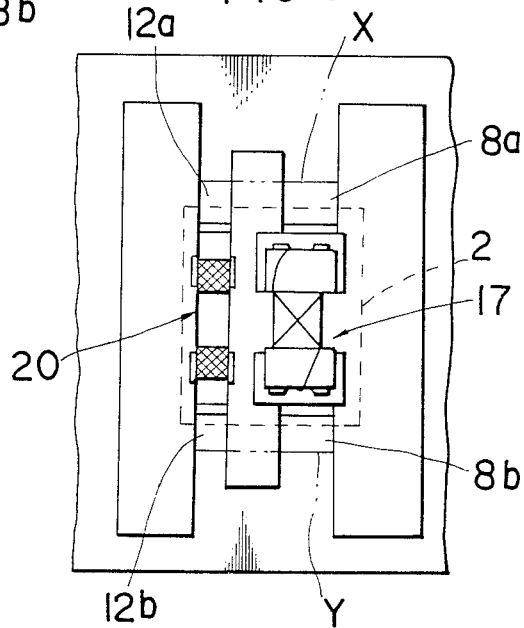
FIG. 5 is a plan view showing a region to form an armor in FIG. 4 and positions to cut projection segments.

Subsequently, an armor 2 is molded out of synthetic resin as shown in FIG. 5 to sheath the inductor 17 and the capacitor 20 held by the first and second terminal members 7, 11.

After completion of such molding step, the projection segments 8a, 12a and 8b, 12b are cut off respectively along lines X and Y shown in FIG. 5.

Figure 6:
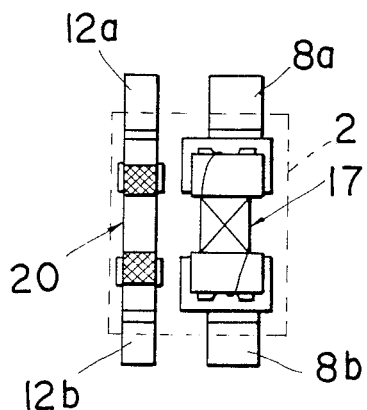
FIG. 6 is a plan view showing merely a zone to constitute a composite part.

The above procedure produces a composite part 1 with the projection segments 8a, 12a and 8b, 12b partially extending outward from the armor 2 as shown in FIG. 6. Then the outer portions of such projection segments 8a, 12a and 8b, 12b are bent along the wall surfaces of the armor 2, so that the composite part 1 is shaped to have the external appearance of FIG. 13 and the circuit configuration of FIG. 14.

The composite part 1 of such configuration is usable as a composite element of an integral structure having both functions of the inductor 17 and the capacitor 20 individually.

Since this composite part 1 is of lead-less type, it is technically suited for surface mounting on a printed wiring board. As the dimensions thereof practically include a width of 5 mm, a depth of 4 mm and a height of 3 mm or so, it becomes possible to set such composite part on the printed wiring board by the use of a mounter after taping the outer surface of the armor 2.

In this step, both the inductor 17 and the capacitor 20 are mountable simultaneously to enhance the circuit part mounting efficiency.

Figure 13:
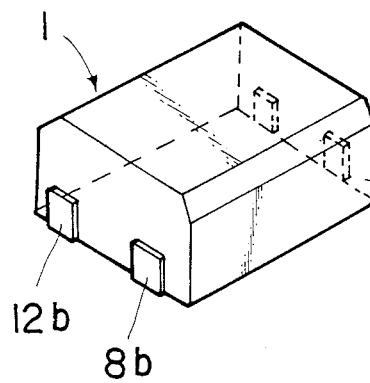
FIG. 13 is a perspective view of a composite part manufactured by a first embodiment of the invention.
Figure 14:
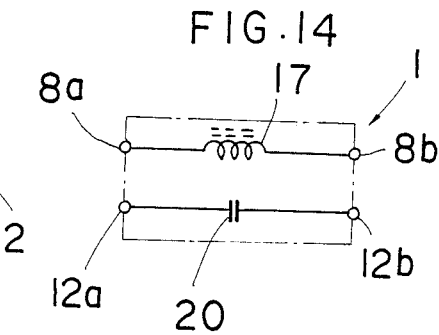
FIG. 14 is an equivalent circuit diagram of the composite part shown in FIG. 13.

Although in the above embodiment the terminal members are cut along the lines X and Y in FIG. 5 to produce the composite part of FIGS. 13 and 14, the cutting points can be selectable as desired to obtain a composite part which exhibits a different function.

Now the principle of manufacturing a composite part of the present invention will be described below with reference to FIGS. 7 through 12.

Figure 7:
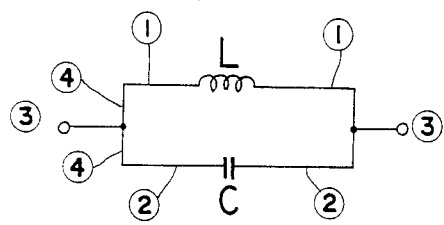
FIG. 7 illustrates an exemplary principle of manufacture according to the prevent invention.
Figure 8:
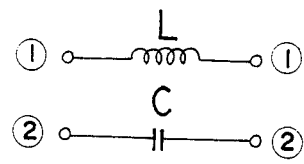
FIGS. 8 through 10 are equivalent circuit diagrams of composite parts having individual circuit configurations obtained from FIG. 7.

In a circuit where an inductor L and a capacitor C are mutually connected as shown in FIG. 7, the configuration with regard to the path between terminals ①—① and the path between terminals ②—② is such that the inductor L and the capacitor C are arranged individually as shown in FIG. 8.

Figure 9:
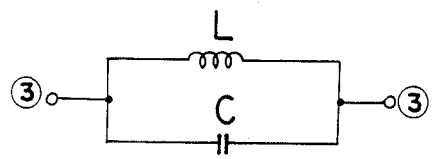

Meanwhile, regarding the path between terminals ③—③ shown in FIG. 7, the circuit configuration is such that the inductor L and the capacitor C are in parallel connection as shown in FIG. 9.

Figure 10:
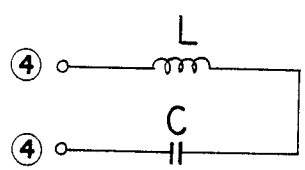

Further with regard to the path between terminals ④—④ shown in FIG. 7, the circuit configuration is such that the inductor L and the capacitor C are in series connection as shown in FIG. 10.

Figure 11:
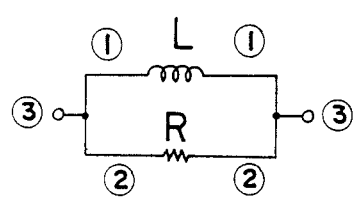
FIGS. 11 and 12 illustrate other exemplary principles of manufacture according to the invention.
Figure 12:
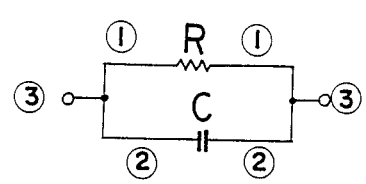

Thus, a desired composite part exhibiting a different function is obtainable by altering the connection between the two circuit parts of an inductor L and a capacitor C. This signifies that such advantage is not limited to a composite part of an inductor L and a capacitor C alone and, as shown in FIG. 11, similar effect is achievable in a combined circuit of an inductor L and a resistor R as well by altering the positions to cut the terminals ①, ②, ③, ④. Furthermore, as shown in FIG. 12, the similar effect is also attained by properly selecting the positions to cut the terminals ①, ②, ③, ④ in a combined circuit of a resistor R and a capacitor C.

Hereinafter a second exemplary embodiment of the present invention will be described.

This embodiment is basically similar to the foregoing first embodiment with the exception that the positions to cut the projection segments 8a, 12a, 8b, 12b posterior to the molding step are changed.

Figure 15:
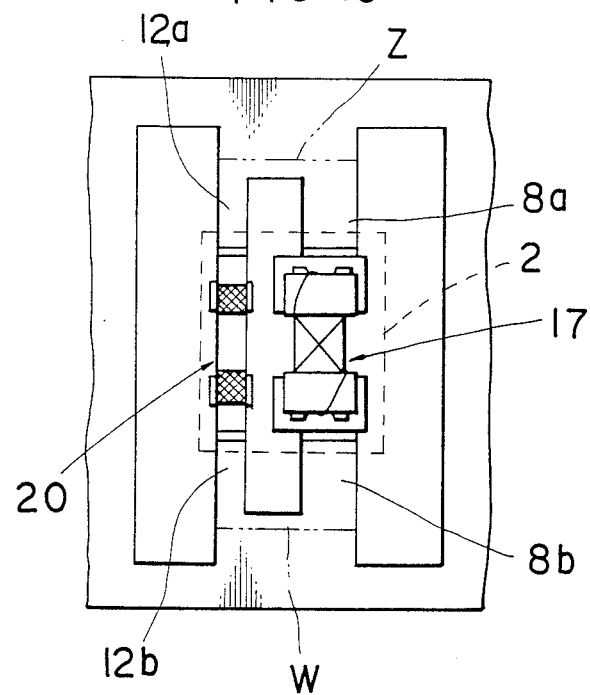
FIG. 15 is a plan view showing positions to cut projection segments in a second embodiment of the invention.
Figure 16:
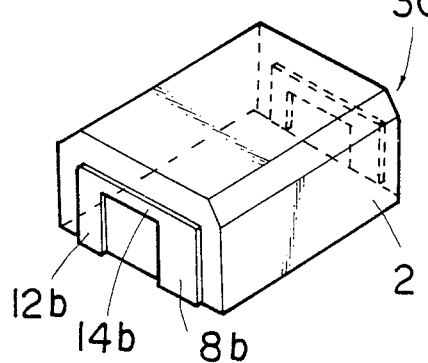
FIG. 16 is a perspective view of a composite part manufactured by the second embodiment of the invention.
Figure 17:
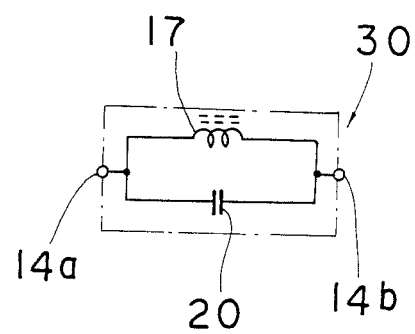
FIG. 17 is an equivalent circuit diagram of the composite part shown in FIG. 16.

After forming an armor 2, as shown in FIG. 15, the projection segments 8a, 12a are cut along a line Z, while the projection segments 8b, 12b are cut along a line W. Then the fore ends of the projection segments 8a, 12a extending outward from the armor 2 are coupled in one base portion 14a, while the fore ends of the projection segments 8b, 12b are coupled in another base portion 14b. Through such cutting step, there can be manufactured a composite part 30 having an external appearance of FIG. 16 and a circuit configuration of FIG. 17 where an inductor 17 and a capacitor 20 are connected in parallel with each other.

The method of manufacturing such composite part 30 is also capable of achieving the same function as in the first embodiment.

Now a third exemplary embodiment of the present invention will be described below. The method in this embodiment is also basically similar to the aforesaid first embodiment with the exception that the positions to cut the projection segments 8a, 12a, 8b, 12b posterior to the molding step are changed.

After forming an armor 2, as shown in FIG. 18, the projection segments 8a, 12a are cut along a line X, while the projection segments 8b, 12b are cut along a line W. Then the fore ends of the projection segments 8a, 12a extending outward from the armor 2 are mutually separated, while the fore ends of the projection segments 8b, 12b are coupled to each other at another base portion 14b. Through such cutting step, there can be manufactured a composite part 40 having an external appearance of FIG. 19 and a circuit configuration of FIG. 16 where an inductor 17 and a capacitor 20 are connected in series with each other.

The method for manufacture of such composite part 40 is also capable of achieving the same function as in the foregoing first embodiment.

Figure 21:
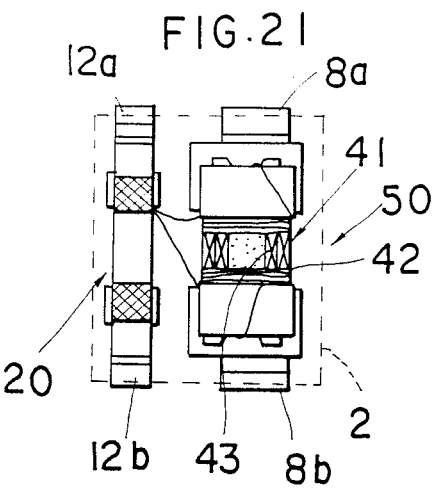
FIG. 21 is a plan view showing circuit parts in a fourth embodiment of the invention and positions to cut projection segments therein.
Figure 22:
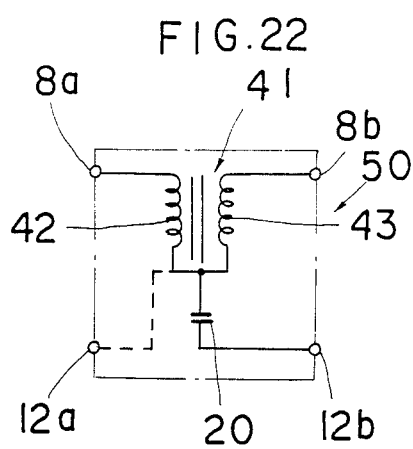
FIG. 22 is an equivalent circuit diagram of the circuit parts shown in FIG. 21.

FIGS. 21 and 22 show a fourth embodiment of the present invention. According to this manufacturing method, a transformer 41 having a primary winding 42 and a secondary winding 43 around a drum core 15 is mounted on a first terminal member 7 instead of an inductor 17; one end of the primary winding 42 of the transformer 41 is connected to a projection segment 8a, one end of the secondary winding 43 to a projection segment 8b, and the other ends of both the primary and secondary windings 42, 43 to a projection segment 12a in common, respectively; and the positions to cut the projection segments 8a, 12a and 8b, 12b are set to be the same as those in the first embodiment.

The above procedure manufactures a composite part 50 having a mode of connection shown in FIG. 22.

And the method for manufacture of such composite part 50 is also capable of achieving the same function as in the aforesaid first embodiment.

Figure 23:
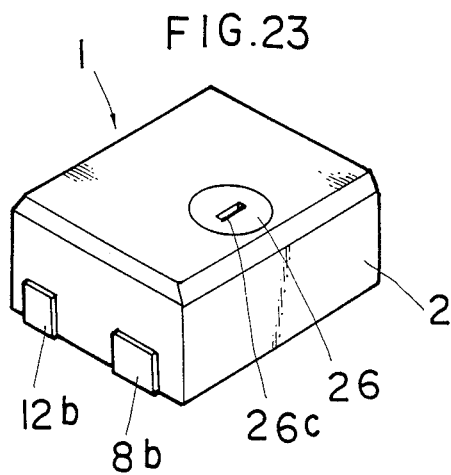
FIGS. 23 and 24 are a perspective view and an equivalent circuit diagram of circuit parts in a fifth embodiment of the invention.
Figure 24:
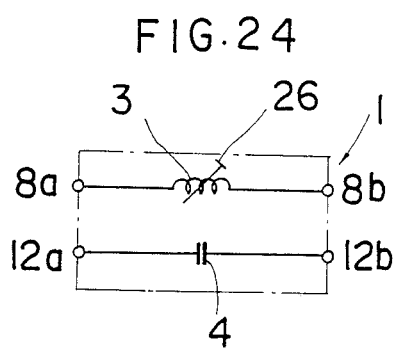

FIG. 23 illustrates the external appearance of a fifth embodiment of a composite part according to the present invention. The composite part 1 comprises an inductor L whose inductance is variable as shown equivalently in FIG. 24 and a capacitor C, and is housed in an armor 2 molded out of synthetic resin. The inductance of the inductor L is varied by an inductance control member 26 incorporated in the armor 2.

Figure 25:
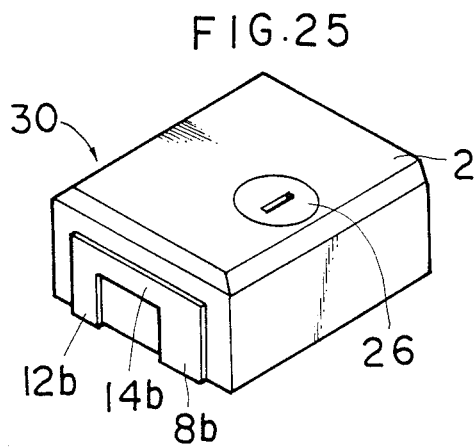
FIGS. 25 and 26 are a perspective view and an equivalent circuit diagram of circuit parts in a sixth embodiment of the invention.
Figure 26:
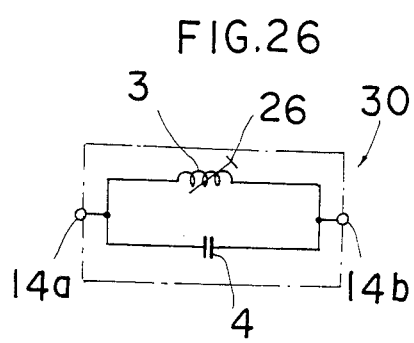

FIGS. 25 and 26 are a perspective view and an equivalent circuit diagram showing a sixth embodiment of the present invention, where the difference from the fifth embodiment resides in that an inductor L and a capacitor C are connected in parallel with each other.

Now an explanation will be given on the process of manufacturing the fifth and sixth embodiments.

First the aforementioned steps illustrated in FIGS. 1 through 4 are executed in the same manner, inclusive of the step of disposing a plurality of circuit parts in a plurality of pairs of terminal members which are formed opposite to each other in punched regions of a lead frame and are coupled in the base portions thereof respectively, the step of connecting the circuit parts to the terminal members, and the step of molding an armor. The difference resides in the addition of a step of forming a recess and another step of setting an inductance control member therein. Such additional steps will now be described below with reference to FIGS. 27 through 30.

Figure 27:
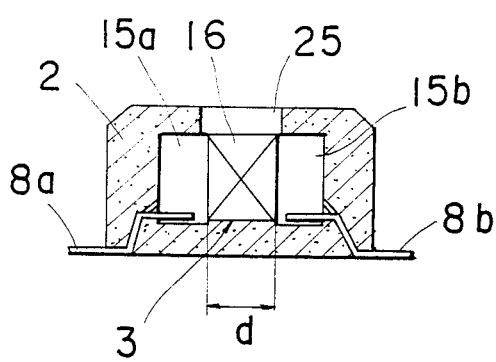
FIGS. 27 through 30 illustrate the steps of manufacturing the circuit parts in the fifth and sixth embodiments.
Figure 28:
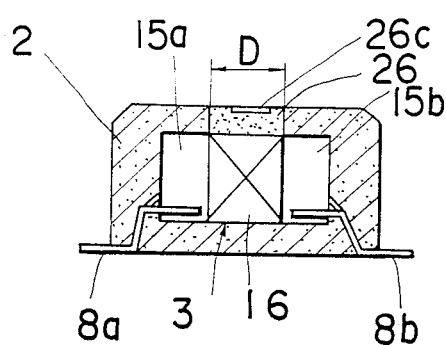
Figure 29:
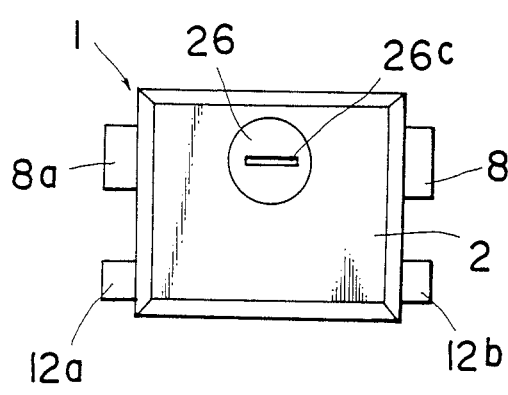
Figure 30:
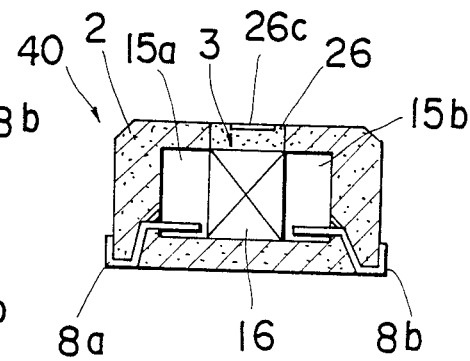
Figure 31:
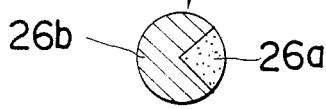
FIGS. 31 (a) through 31 (c) are sectional views showing the structures of inductance control members used in the fifth and sixth embodiments.
Figure 31:
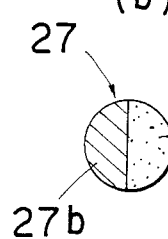
Figure 31:
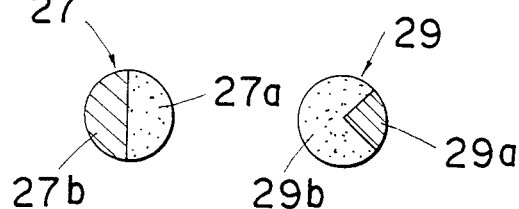

As shown in FIG. 27, a circular recess 25 is formed at the center of an inductor 2 immediately above a coil 16, and a columnar inductance control member 26 having a rotation adjustment slot 26c on its top is set in the recess 25 as shown in FIG. 28, whereby such member 26 is disposed above the coil 16. Its plan view is shown in FIG. 29. And the projection segments 8a, 8b, 12a, 12b are so bent as to contact the wall surfaces of the armor 2 to obtain a desired product, as shown in FIG. 30. The inductance control member 26 employed is composed of, for example, one quarter of a magnetic portion 26a and the rest of a nonmagnetic portion 26b as shown in FIG. 31 (a). However, it is also possible to use a modification such as an inductance control member 27 composed of one half of a magnetic portion 27a and the rest of a nonmagnetic portion 27b as shown in FIG. 31 (b); or an inductance control member 29 composed of three quarters of a magnetic portion 29a and the rest of a nonmagnetic portion 29b as shown in FIG. 31 (c).

For the purpose of ensuring stable rotation adjustment, it is desired that, in relation to the length d of the wound portion of the coil 16, the diameter D of the inductance control member 26 be so selected as to satisfy the condition $D>>d$ or $D>d$.

Figure 32:
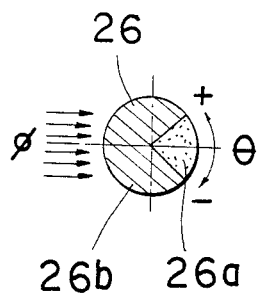
FIGS. 32 and 33 are a sectional view and a characteristic diagram showing the principle of operation of the inductance control member.

In the inductance control executed for the inductor L by the control member 26, the magnetic flux $\phi$ generated by the application of a current to the coil 16 of the inductor L and advanced from the N-pole through the inductance control member 26 toward the S-pole of the coil 16 as shown in FIG. 32 changes the state of interlinkage to the inductance control member 26 depending on the rotational position thereof.

Figure 33:
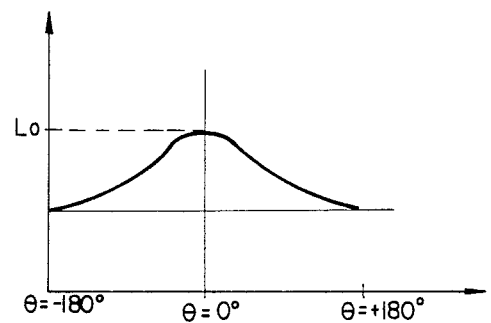

Suppose now that the rotation angle $\theta$ of the inductance control member 26 becomes 0° when its magnetic portion 26a located on the side toward the flange 15b is positioned symmetrically with respect to the direction of passage of the magnetic flux $\phi$, as illustrated in FIG. 32. Then the inductance of the inductor L in this arrangement has a maximum value $L_0$ as graphically shown in FIG. 33. And if the inductance control member 26 is rotated in either of the plus (+) or minus (−) directions from the position where $\theta=0°$, the inductance becomes smaller in accordance with the rotational position. Consequently, it becomes possible to selectively set the inductance of the inductor L at any desired value by changing the rotational position of the inductance control member 26 in conformity with the circuit condition and so forth.

Figure 34:
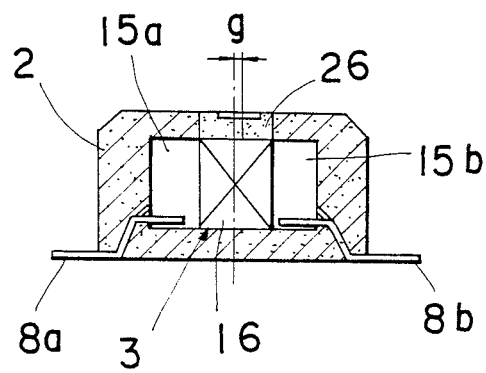
FIG. 34 is a sectional view of another exemplary embodiment of the invention.

FIG. 34 shows a seventh embodiment of a composite part according to the present invention.

The difference of this composite part 70 from the aforesaid fifth and sixth embodiments resides in that its recess is formed, in the molding step, with a positional deviation of a fixed distance g toward the flange 15b, and the inductance control member 26 is incorporated in such recess.

As a result, the composite part 70 comes to have a connection structure similar to that of the fifth and sixth embodiments.

The principle of manufacture shown in FIGS. 7 through 10 and that shown in FIG. 11 relative to the LR combined circuit are both applicable to any of the fifth through seventh embodiments as well.

What is claimed is:

1. A composite part, comprising:
   an electrically conductive punched-out web-like plate member including at least a pair of first projection segments and a pair of second projection segments, said first and second projection segments in each pair being parallel to each other in a longitudinal direction of the plate number, said pair of first projection segments being symmetrical in a direction transverse to said longitudinal direction, said pair of second projection segments being symmetrical in a direction transverse to said longitudinal direction, a base portion coupling said first and second projection segments in each pair to each other, said first and second projection segments in each pair having adjacent portions positioned near distal ends, respectively, thereof, and base portions coupled to sides of said first and second projection segments in each pair and positioned at remote ends of said first and second projection segments, remote from said distal ends of the first and second projection segments, wherein said distal ends of said projection segments are bent up and away from a bottom plane containing the remote ends of said projection segments;

a plurality of circuit components mounted respectively on the distal ends of said first and second projection segments;

an armor molded of resin and encasing each of said distal ends of the first and second projection segments and circuit components corresponding thereto; and wherein at least a portion of said remote ends of said first and second projection segments are substantially flush with a bottom of said armor and are not covered by said armor, and other portions of said remote ends of said first and second projection segments extend from said armor and are bent along wall surfaces of said armor and wherein said web-like member is severable along a selected one of different lines such that said first and second segments remain joined together or become separated from one another.

2. The composite part as defined in claim 1, wherein said circuit parts are an inductor and a capacitor combined with each other.

3. The composite part as defined in claim 1, wherein said circuit parts are a transformer and a capacitor combined with each other.

4. The composite part as defined in claim 1, wherein said circuit parts are an inductor and a resistor combined with each other.

5. The composite part as defined in claim 1, wherein said plurality of circuit parts are connected in parallel with each other.

6. The composite part as defined in claim 1, wherein said plurality of circuit parts are connected in series with each other.

7. The composite part as defined in claim 1, wherein said plurality of circuit parts are not connected with each other.

8. A composite part, comprising:

a plurality of pairs of terminal members formed in punched regions of a lead frame opposite to each other and shaped by cutting at predetermined positions a plurality of pairs of projection segments coupled in the respective base portions thereof, said first and second projection segments in each pair having adjacent portions positioned near distal ends, respectively, thereof, and wherein said distal ends of projection segments are bent up and away from a bottom plane containing remote ends of said projection segments, said remote ends located remote from said distal ends;

a plurality of circuit parts including at least an inductor and disposed in said terminal members respectively;

an armor molded in a region except said circuit parts and the base portions of said projection segments, and having a recess at its predetermined position corresponding to said inductor, and wherein at least a portion of said remote ends of said first and second projection segments are substantially flush with a bottom of said armor and are not covered by said armor; and an inductance control member composed partially of a magnetic material and disposed in said recess wherein other portions of said remote ends of said projection segments extend outward from said armor and are formable into different shapes depending on the cut points thereof are bent along the wall surfaces of said armor, and the inductance of said inductor is settable at a desired value by adjusting the angle of rotation of said inductance control member.

9. The composite part as defined in claim 8, wherein said circuit parts are an inductor and a capacitor combined with each other.

10. The composite part as defined in claim 8, wherein said circuit parts are an inductor and a resistor combined with each other.

11. The composite part as defined in claim 8, wherein said circuit parts are connected in parallel with each other.

12. The composite part as defined in claim 8, wherein said circuit parts are connected in series with each other.

13. The composite part as defined in claim 8, wherein said circuit parts are not connected with each other.

14. The composite part as defined in claim 8, wherein said inductor comprises a drum core and a coil wound around the central portion of said drum core, and said inductance control member is incorporated at a position corresponding to the coil of said inductor.

15. The composite part as defined in claim 8, wherein said inductor comprises a drum core and a coil wound around the central portion of said drum core, and said inductance control member is incorporated at a position deviating from said coil toward one of flanges thereof.

16. The composite part as defined in claim 8, wherein said inductance control member is composed partially of a magnetic material.

17. The composite part as defined in claim 8, wherein said inductance control member is composed of a magnetic portion and a nonmagnetic portion.

18. A method of manufacturing a composite part, comprising the steps of:

disposing a plurality of circuit parts respectively in a plurality of pairs of terminal members formed in punched regions of a lead frame opposite to each other, each terminal member having a distal end adjacent an opposite terminal of each pair of terminals and a remote end, remote from said distal end, and coupled to respective base portions thereof:

bending said distal ends of said terminal members up and away from a bottom plane containing said remote ends of said terminal members;

executing required wiring between said circuit parts and said terminal members;

molding an armor out of synthetic resin in a region except said circuit parts, the base portions of said terminal members, and at least a portion of said remote ends of said terminal members such that said portions of said remote ends are substantially flush with a bottom of said armor and are not covered by said armor; and cutting at desired positions other portions of said remote ends of said terminal members extending outward from said armor, and then bending said other portions of said remote ends along the outer wall surfaces of said armor, wherein a composite part having any desired one of various connection modes is produced by selectively changing the wiring of said circuit parts and the cut positions of said terminal members.

19. The method as defined in claim 18, wherein said circuit parts are an inductor and a capacitor combined with each other.

20. The method as defined in claim 18, wherein said circuit parts are a transformer and a capacitor combined with each other.

21. The method as defined in claim 18, wherein said circuit parts are an inductor and a resistor combined with each other.

22. The method as defined in claim 18, wherein said circuit parts are a capacitor and a resistor combined with each other.

23. The method as defined in claim 18, wherein said terminal members are cut at the positions for parallel connection of said circuit parts.

24. The method as defined in claim 18, wherein said terminal members are cut at the positions for series connection of said circuit parts.

25. A method of manufacturing a composite part, comprising the steps of:

disposing a plurality of circuit parts respectively in a plurality of pairs of terminal members formed in punched regions of a lead frame opposite to each other, each terminal member having a distal end adjacent an opposite terminal of each pair of terminals and a remote end, remote from said distal end, and coupled to respective base portions thereof, said circuit parts including at least an inductor to be connected to said terminal members;

bending said distal ends of said terminal members up and away from a bottom plane containing said remote ends of said terminal members;

executing required wiring between said circuit parts and said terminal members;

molding an armor out of synthetic resin in a region except said circuit parts, the base portions of said terminal member, and at least a portion of said remote ends of said terminal members such that said portions of said remote ends are substantially flush with a bottom of said armor and are not covered by said armor;

forming a recess in said armor at a predetermined position corresponding to said inductor;

disposing in said recess an inductance control member composed partially of a magnetic material; and cutting at desired positions other portions of said remote ends of said terminal members extending outward from said armor, and then bending said other portions of said remote ends along the outer wall surfaces of said armor, wherein a composite part having any desired one of various connection modes is produced by selectively changing the wiring of said circuit parts and the cut positions of said terminal members.

26. The method as defined in claim 25, wherein said circuit parts are an inductor and a capacitor combined with each other.

27. The method as defined in claim 25, wherein said circuit parts are an inductor and a resistor combined with each other.

28. The method as defined in claim 25, wherein said terminal members are cut at the positions for parallel connection of said circuit parts.

29. The method as defined in claim 25, wherein said terminal members are cut at the positions for series connection of said circuit parts.

* * * * *